United States Patent
Tsao et al.

(10) Patent No.: US 10,783,818 B2
(45) Date of Patent: Sep. 22, 2020

(54) DUAL GATE TRANSISTOR CIRCUIT, PIXEL CIRCUIT AND GATE DRIVE CIRCUIT THEREOF

(71) Applicant: Au Optronics Corporation, Hsinchu (TW)

(72) Inventors: Shu-Wei Tsao, Taipei (TW); Chi-Jui Lin, Hualien County (TW); Shu-Feng Wu, Miaoli County (TW); Wei-Sheng Yu, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/439,730

(22) Filed: Jun. 13, 2019

(65) Prior Publication Data
US 2020/0035139 A1  Jan. 30, 2020

(30) Foreign Application Priority Data
Jul. 24, 2018  (TW) .............................. 107125543 A

(51) Int. Cl.
*G09G 3/20* (2006.01)

(52) U.S. Cl.
CPC ....... *G09G 3/20* (2013.01); *G09G 2310/0286* (2013.01); *G09G 2320/0214* (2013.01)

(58) Field of Classification Search
CPC combination set(s) only.
See application file for complete search history.

(56) References Cited

U.S. PATENT DOCUMENTS

| | | | |
|---|---|---|---|
| 7,414,600 B2 | 8/2008 | Nathan et al. | |
| 8,378,418 B2 * | 2/2013 | Kitamura | H01L 27/0629 257/329 |
| 8,928,564 B2 | 1/2015 | Park et al. | |
| 8,957,889 B2 * | 2/2015 | Miyake | G09G 3/32 345/212 |
| 9,786,222 B2 * | 10/2017 | Lim | G09G 3/3233 |
| 9,818,345 B2 * | 11/2017 | Shim | G09G 3/3258 |
| 10,056,037 B1 * | 8/2018 | Nie | G09G 3/3258 |
| 2011/0273419 A1 | 11/2011 | Park et al. | |
| 2012/0211756 A1 * | 8/2012 | Tanahara | G02F 1/136204 257/59 |
| 2012/0249510 A1 | 10/2012 | Jankovic et al. | |
| 2016/0300526 A1 | 10/2016 | Lim et al. | |
| 2018/0302007 A1 * | 10/2018 | Zhou | H02M 7/5388 |

FOREIGN PATENT DOCUMENTS

| | | |
|---|---|---|
| CN | 105280141 | 1/2016 |
| KR | 20110123984 | 11/2011 |

\* cited by examiner

Primary Examiner — Van N Chow
(74) Attorney, Agent, or Firm — JCIPRNET

(57) ABSTRACT

A dual gate transistor circuit, a pixel circuit, and a gate drive circuit are provided. The dual gate transistor circuit includes a dual gate transistor, a first diode, and a second diode. The dual gate transistor has a first gate and a second gate, and the first gate receives a drive signal. The first diode is connected in series between the first gate and the second gate according to a first-polarity direction. The second diode is connected in series between the first gate and the second gate according to a second-polarity direction. The first-polarity direction is opposite to the second-polarity direction.

12 Claims, 4 Drawing Sheets

DUAL GATE TRANSISTOR CIRCUIT, PIXEL CIRCUIT AND GATE DRIVE CIRCUIT THEREOF

CROSS REFERENCE TO RELATED APPLICATION

This application claims the priority benefit of Taiwan application serial no. 107125543, filed on Jul. 24, 2018. The entirety of the above-mentioned patent application is hereby incorporated by reference herein and made a part of specification.

BACKGROUND

Technical Field

The invention relates to a display apparatus. More particularly, the invention relates to a dual gate transistor circuit, a pixel circuit, and a gate drive circuit thereof capable of effectively increasing a working current in a working state and lowering a leakage current in an off (idle) state.

Description of Related Art

Along with advancement of the electronic technology, consumer electronic products have become indispensable in our daily lives. In order to provide a favorable human-machine interface, the trend to dispose high-quality display apparatuses on the consumer electronic products has become increasingly popular.

While manufacturing a display panel, a designer tends to reduce the size of the transistor (e.g., a thin film transistor), so that the display region of the display panel may feature a high aperture ratio and a narrow border. However, in such a situation, the display panel may easily be insufficiently charged, and the display panel's capability of driving a circuit may also be lowered. The quality of image display is thereby affected.

SUMMARY

The invention provides a dual gate transistor circuit capable of effectively increasing a working current in a working state and lowering a leakage current in an off (idle) state.

The invention further provides a pixel circuit and a gate drive circuit thereof applied to the dual gate transistor circuit and capable of effectively improving display quality.

In an embodiment of the invention, a dual gate transistor circuit includes a dual gate transistor, a first diode, and a second diode. The dual gate transistor has a first gate and a second gate, and the first gate receives a drive signal. The first diode is connected in series between the first gate and the second gate according to a first-polarity direction. The second diode is connected in series between the first gate and the second gate according to a second-polarity direction. The first-polarity direction is opposite to the second-polarity direction.

In an embodiment of the invention, a pixel circuit includes a dual gate transistor circuit, a pixel capacitor, and a storage capacitor. A first terminal of the dual gate transistor circuit receives a data signal. The pixel capacitor is coupled to a second terminal of the dual gate transistor. One terminal of the storage capacitor is coupled to the second terminal of the dual gate transistor, and another terminal of the storage capacitor receives a common voltage.

In an embodiment of the invention, a gate drive circuit includes a plurality of shift register units. The shift register units are coupled in series to form a shift register circuit. An Nth stage shift register unit includes a first dual gate transistor circuit, a second dual gate transistor circuit, and a third dual gate transistor circuit. The first dual gate transistor circuit is coupled between a drive terminal and a reference grounding terminal and is controlled by a rear stage output signal to pull down a drive voltage on a drive terminal. The second dual gate transistor circuit is coupled between an output terminal and the reference grounding terminal and is controlled by the rear stage output signal to pull down an output voltage on the output terminal. The third dual gate transistor circuit is coupled between a clock signal terminal and the output terminal and is controlled by the drive voltage to pull up the output voltage on the output terminal according to a clock signal on the clock signal terminal. Each of the first dual gate transistor circuit, the second dual gate transistor circuit, and the third dual gate transistor circuit includes a dual gate transistor, a first diode, and a second diode. The dual gate transistor has a first gate and a second gate. The first diode is connected in series between the first gate and the second gate according to a first-polarity direction. The second diode is connected in series between the first gate and the second gate according to a second-polarity direction. The first-polarity direction is opposite to the second-polarity direction. The first gate of the first dual gate transistor circuit and the first gate of the second dual gate transistor circuit receive the rear stage output signal, and the first gate of the third dual gate transistor circuit receives the drive voltage.

To sum up, in the dual gate transistor circuit provided by the invention, a voltage difference between the first gate and the second gate of the dual gate transistor may be determined according to the turning on or turning off state of the diodes. Furthermore, the working current in the working state can be effectively increased, and the leakage current in the off (or idle) state can be reduced through adjusting the voltage difference, as such, further improving the working performance of the dual gate transistor circuit.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
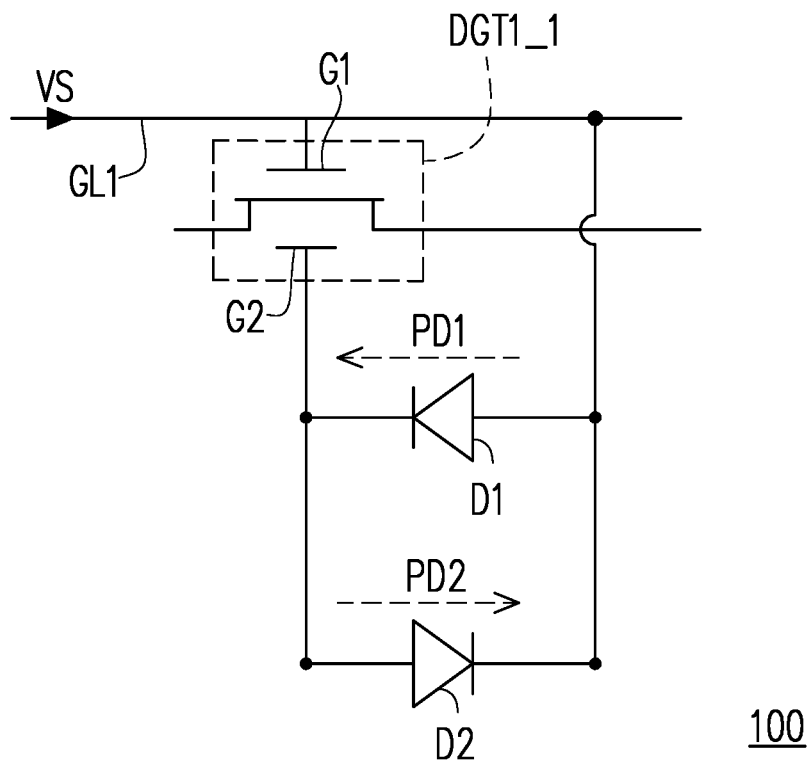
FIG. 1 is a circuit diagram of a dual gate transistor circuit according to an embodiment of the invention.

FIG. 1 is a circuit diagram of a dual gate transistor circuit according to an embodiment of the invention. In this embodiment, a dual gate transistor circuit 100 includes a dual gate transistor DGT1_1, a diode D1, and a diode D2. Specifically, the dual gate transistor DGT1_1 of this embodiment has a first gate G1, and a second gate G2. The first gate G1 of the dual gate transistor DGT1_1 may receive a drive signal VS through a gate line GL1, and the dual gate transistor DGT1_1 is controlled by the drive signal VS. The diode D1 can be connected in series between the first gate G1 and the second gate G2 (e.g., a cathode terminal and an anode terminal of the diode D1 are respectively coupled to the second gate G2 and the first gate G1) according to a first-polarity direction PD1. Furthermore, the diode D2 can be connected in series between the first gate G1 and the second gate G2 (e.g., the cathode terminal and the anode terminal of the diode D2 are respectively coupled to the first gate G1 and the second gate G2) according to a second-polarity direction PD2. Herein, the first-polarity direction PD1 is opposite to the second-polarity direction PD2.

Note that in this embodiment, people having ordinary skill in the art may determine a number of the diode D1 and a number of the diode D2 according to design requirement of the dual gate transistor circuit 100, and the number of the first diode D1 and the number of the diode D2 are not limited to the numbers depicted in FIG. 1. In addition, sizes and electrical characteristics of the diode D1 and the diode D2 may also be designed according to actual needs and are not particularly limited.

Regarding detailed description of operation of the dual gate transistor circuit 100, to be specific, when the drive signal VS is set to be a positive-polarity voltage and a voltage value of the positive-polarity voltage is greater than a threshold voltage of the diode D1, the dual gate transistor DGT1_1 can be operated in a working state. Simultaneously, the diode D1 can be turned on in a forward bias, and the diode D2 can be turned off in a reverse bias. In such a situation, a voltage value V2 on the second gate G2 of the dual gate transistor DGT1_1 is approximately equal to a voltage value V1 on the first gate G1 of the dual gate transistor DGT1_1 minus (equal to a voltage value of the drive signal VS) the threshold voltage of the diode D1. In other words, when the drive signal VS is a positive-polarity voltage, the voltage value V1 on the first gate G1 of the dual gate transistor DGT1_1 can be greater than the voltage value V2 on the second gate G2 of the dual gate transistor circuit 100.

In contrast, when the drive signal VS is set to be a negative-polarity voltage and a voltage value of the negative-polarity voltage is less than a threshold voltage of the diode D2, the dual gate transistor DGT1_1 can be operated in an off (or idle) state. Simultaneously, the diode D1 can be turned off in the reverse bias, and the diode D2 may be turned on in the forward bias. In such a situation, the voltage value V2 on the second gate G2 of the dual gate transistor DGT1_1 is approximately equal to the voltage value V1 on the first gate G1 of the dual gate transistor DGT1_1 (equal to the voltage value of the drive signal VS) plus a voltage value of the threshold voltage of the diode D2. In other words, when the drive signal VS is a negative-polarity voltage, the voltage value V1 on the first gate G1 of the dual gate transistor DGT1_1 can be less than the voltage value V2 on the second gate G2 of the dual gate transistor DGT1_1.

Based on the above, in this embodiment, when the dual gate transistor circuit 100 is operated in the working state (i.e., the drive signal VS is set to be the positive-polarity voltage), since the first gate G1 and the second gate G2 of the dual gate transistor DGT1_1 both have the positive-polarity voltages (and the voltage value V1 is greater than the voltage value V2), a working current of the dual gate transistor DGT1_1 operated in the working state can be correspondingly pulled up. In contrast, when the dual gate transistor circuit 100 is operated in the off (or idle) state (i.e., the drive signal VS is set to be the negative-polarity voltage), since the first gate G1 and the second gate G2 of the dual gate transistor DGT1_1 both have the negative-polarity voltages (and the voltage value V1 is less than the voltage value V2), a leakage current that may be generated can be correspondingly reduced when the dual gate transistor DGT1_1 is operated in the off (or idle) state. In this way, in the dual gate transistor circuit 100 provided by the embodiments of the invention, a voltage difference (i.e., voltage V1–voltage V2) between the first gate G1 and the second gate G2 of the dual gate transistor DGT1_1 may be determined according to the turning on or turning off state of the diode D1 and the diode D2. Furthermore, the working current in the working state can be effectively increased, and the leakage current in the off (or idle) state can be reduced through adjusting the voltage difference (i.e., adjusting the threshold voltage values of the diode D1 and the diode D2), as such, further improving the working performance of the dual gate transistor circuit 10.

Figure 2A:
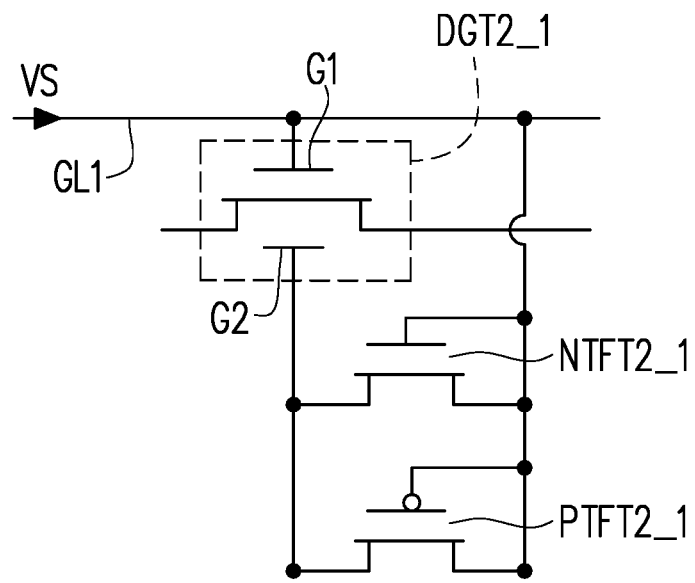
FIG. 2A is a circuit diagram of a dual gate transistor circuit according to another embodiment of the invention.

FIG. 2A is circuit diagram of a dual gate transistor circuit according to another embodiment of the invention. With reference to FIG. 1 and FIG. 2A together, in this embodiment, a dual gate transistor circuit 200A is relatively similar to the dual gate transistor circuit 100, and identical or similar elements are assigned with identical or similar reference numerals. Differentiating from the previous embodiment, in this embodiment, a transistor NTFT2_1 and a transistor PTFT2_1 are respectively implemented in place of the diode D1 and the diode D2, and the transistor NTFT2_1 and the transistor PTFT2_1 can respectively construct the diode D1 and the diode D2 using a diode connection method.

To be specific, in this embodiment, a control terminal (e.g., a gate terminal) and a first terminal (e.g., a drain terminal) of the transistor NTFT2_1 are coupled to a first gate G1 of a dual gate transistor DGT2_1, and a second terminal (e.g., a source terminal) of the transistor NTFT2_1 is coupled to a second gate G2 of the dual gate transistor DGT2_1. From another perspective, a control terminal (e.g., the gate terminal) and a first terminal (e.g., the drain terminal) of the transistor PTFT2_1 are coupled to the first gate G1 of the dual gate transistor DGT2_1, and a second terminal (e.g., the source terminal) of the transistor PTFT2_1 is coupled to the second gate G2 of the dual gate transistor DGT2_1. Herein, the transistor NTFT2_1 can be an n-type thin film transistor, and the transistor PTFT2_1 can be a p-type thin film transistor.

Note that in this embodiment, operational relationships among the elements of the dual gate transistor circuit 200A operated in the working state and in the off (or idle) state are identical to or similar to the content described in FIG. 1, and thus no further description is provided hereinafter.

Figure 2B:
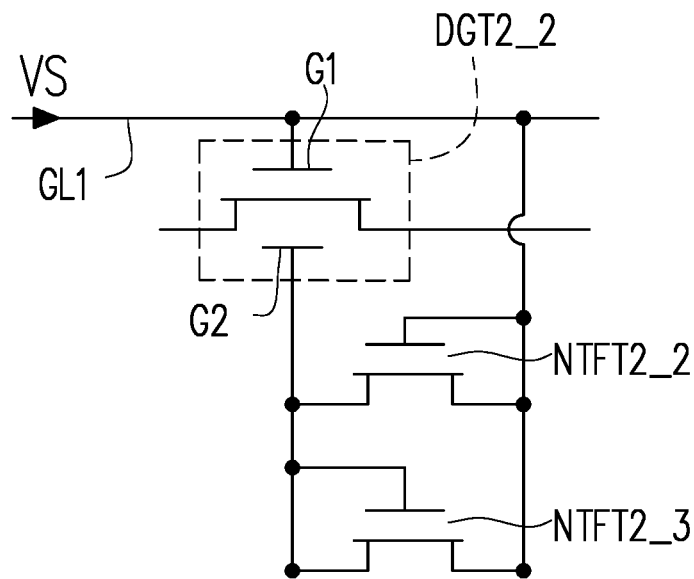
FIG. 2B is a circuit diagram of a dual gate transistor circuit according to still another embodiment of the invention.

FIG. 2B is a circuit diagram of a dual gate transistor circuit according to still another embodiment of the invention. With reference to FIG. 1, FIG. 2A, and FIG. 2B together, in this embodiment, a dual gate transistor circuit 200B is relatively similar to the dual gate transistor circuit 100 and the dual gate transistor circuit 200A, wherein identical or similar elements are assigned with identical or similar reference numerals. Differentiating from the embodiments of FIG. 1 and FIG. 2A, in this embodiment, the diode D2 or the transistor PTFT2_1 may be implemented through a transistor NTFT2_3 (or through a transistor NTFT2_2 and the transistor NTFT2_3 and may both be the p-type thin film transistors at the same time), and the transistor NTFT2_3 similarly can construct the diode D1 and the diode D2 using the diode connection method.

To be specific, in this embodiment, a first terminal (e.g., the source terminal) of the transistor NTFT2_3 is coupled to a first gate G1 of the dual gate transistor DGT2_2, and a control terminal (e.g., the gate terminal) and a second terminal (e.g., the drain terminal) of the transistor NTFT2_3 are together coupled to a second gate G2 of the dual gate transistor DGT2_2 together. Herein, the transistor NTFT2_2 and the transistor NTFT2_3 can be the n-type thin film transistors.

Incidentally, in the embodiments of FIG. 2A and FIG. 2B, a designer may further set voltage values of threshold voltages of the transistors NTFT2_1 to NTFT2_3 and the transistor PTFT2_1 according to operational requirements of the dual gate transistor circuit 200A and the dual gate transistor circuit 200B. That is, in the embodiment of FIG. 2A, when the voltage value of the threshold voltage of the transistor NTFT2_1 is less than 0, the designer can independently adjust the voltage value of the threshold voltage of the transistor PTFT2_1 as well. As such, the dual gate transistor circuit 200A can still be normally operated, so as to determine the voltage difference (i.e., the voltage V1-the voltage V2) between the first gate G1 and the second gate G2.

Figure 3:
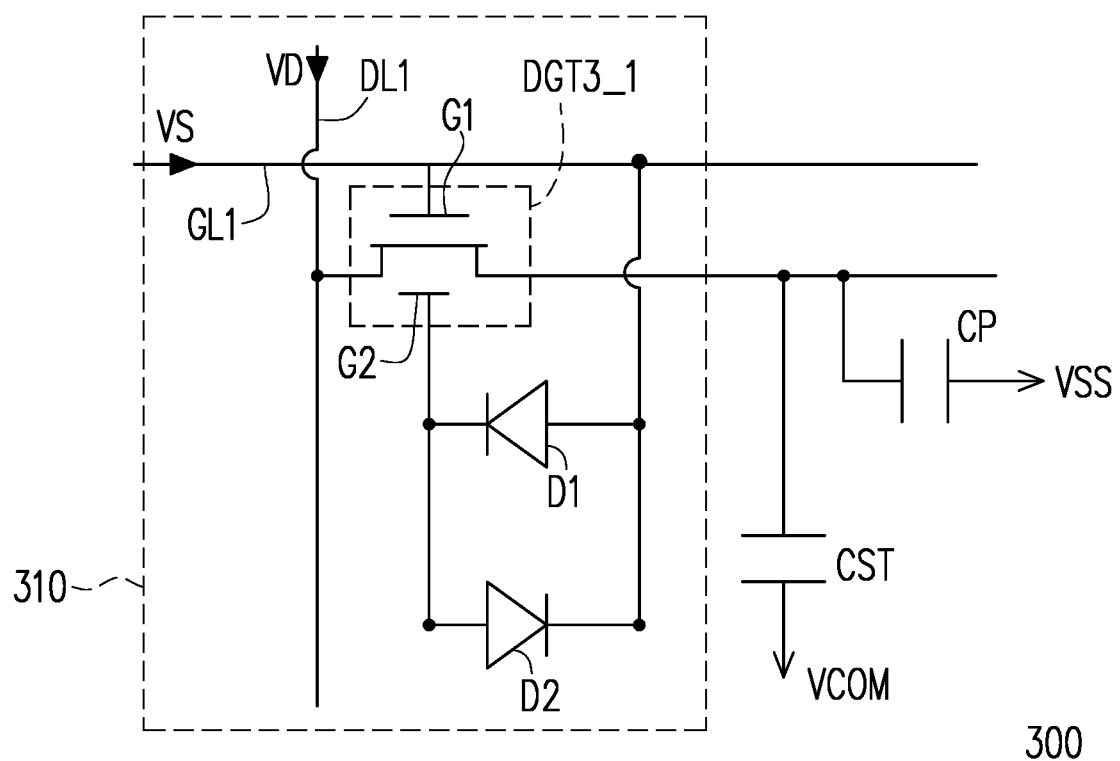
FIG. 3 is a circuit diagram of a pixel circuit according to an embodiment of the invention.

FIG. 3 is a circuit diagram of a pixel circuit according to an embodiment of the invention. In this embodiment, a pixel circuit 300 includes a dual gate transistor DGT3_1, a diode D1, a diode D2, a pixel capacitor CP, and a storage capacitor CST. A first gate G1 of the dual gate transistor DGT3_1 can receive the drive signal VS through a gate line GL1, and a first terminal of the dual gate transistor DGT3_1 (e.g., the source terminal) can receive a data signal VD through a data line DL1. From another perspective, the pixel capacitor CP is coupled between a second terminal (e.g., the drain terminal) of the dual gate transistor DGT3_1 and a reference grounding terminal VSS to store a correct display pixel. A first terminal of a storage capacitor CST is coupled to the second terminal of the dual gate transistor DGT3_1, and a second terminal of the storage capacitor CST may receive a common voltage VCOM. Herein, the storage capacitor CST is configured to store a pixel voltage. Note that a dual gate transistor circuit 310 of this embodiment may be applied to the dual gate transistor circuit 100, the dual gate transistor circuit 200A, or the dual gate transistor circuit 200B of FIG. 1, FIG. 2A, and FIG. 2B, and related operational details are described in the foregoing embodiments in detail, and thus no further description is provided hereinafter.

Figure 4:
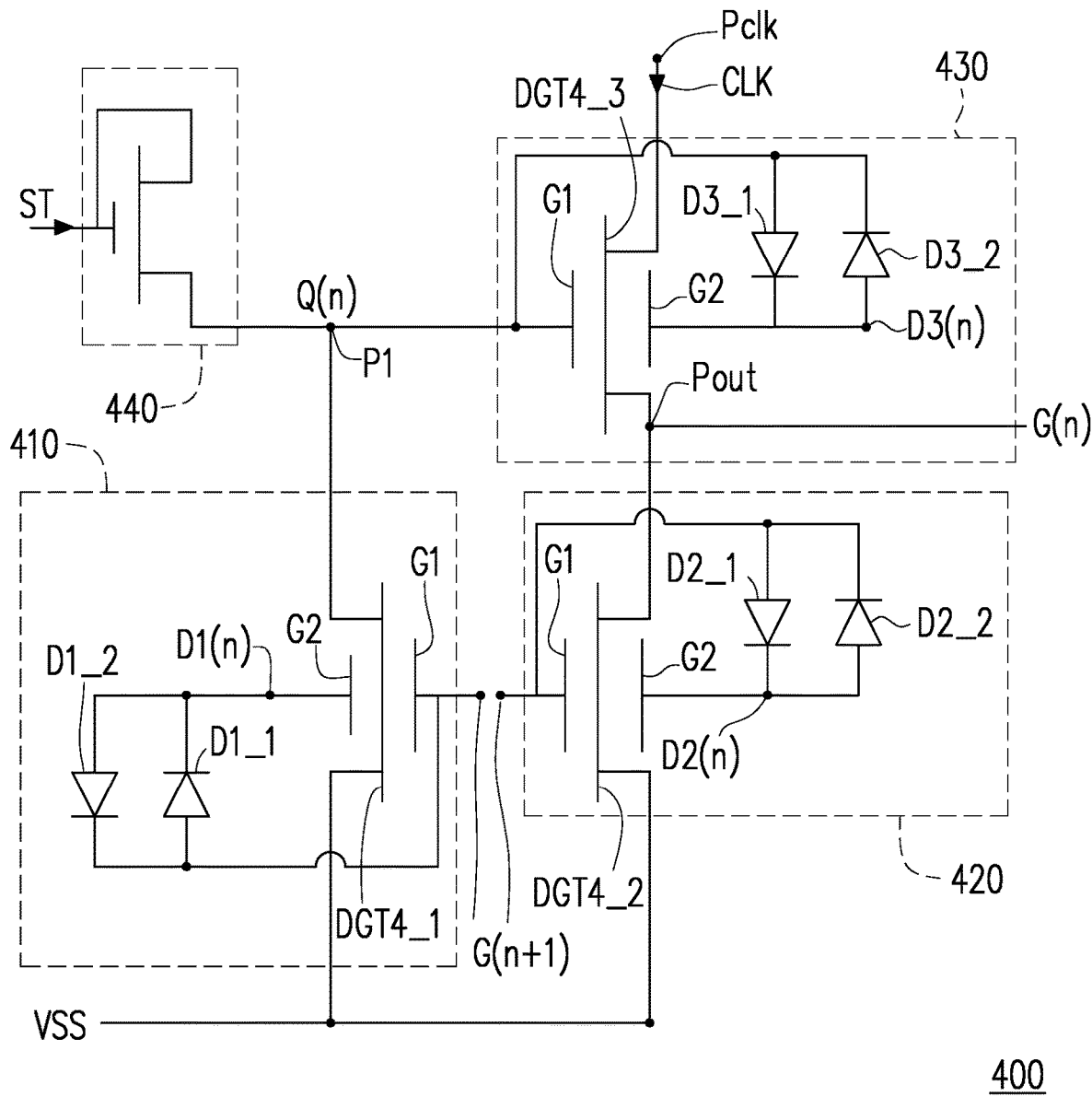
FIG. 4 is a circuit diagram of a shift register unit according to an embodiment of the invention.

FIG. 4 is a circuit diagram of a shift register unit according to an embodiment of the invention. A gate drive circuit (not shown) provided by the present embodiment of the invention may include a plurality of shift register units, and the shift register units may be coupled in series to form a shift register circuit. Herein, FIG. 4 illustrates an Nth stage shift register unit 400 in the shift register circuit, and N is a positive integer.

In this embodiment, the shift register unit 400 includes dual gate transistor circuits 410 to 430 and a pull-up control circuit 440. To be specific, the dual gate transistor circuit 410 is coupled between a drive terminal P1 and the reference grounding terminal VSS, and the dual gate transistor circuit 410 may be controlled by a rear stage output signal G(n+1). The dual gate transistor circuit 420 is coupled between an output terminal Pout and the reference grounding terminal VSS, and the dual gate transistor circuit 420 may be controlled by the rear stage output signal G(n+1) as well. In another aspect, the dual gate transistor circuit 430 is coupled between a clock signal terminal Pclk and the output terminal Pout, and the dual gate transistor circuit 430 may be controlled by a drive voltage Q(n) on the drive terminal P1. The pull-up control circuit 440 is coupled to the drive terminal P1 and receives a start pulse signal ST. Herein, the output voltage G(n) on the output terminal Pout of this embodiment may act as the start pulse signal of the next stage shift register unit, but the invention is not limited thereto.

Note that in FIG. 4, the dual gate transistor circuits 410 to 430 may respectively include dual gate transistors DGT4_1 to DGT4_3, diodes D1_1 to D1_2, diodes D2_1 to D2_2, and diodes D3_1 to D3_2. Note that the dual gate transistor circuits 410 to 430 of this embodiment may be applied to the dual gate transistor circuit 100, the dual gate transistor circuit 200A, or the dual gate transistor circuit 200B of FIG. 1, FIG. 2A, and FIG. 2B, and related operational details are described in the foregoing embodiments in detail, and thus no further description is provided hereinafter.

Figure 5:
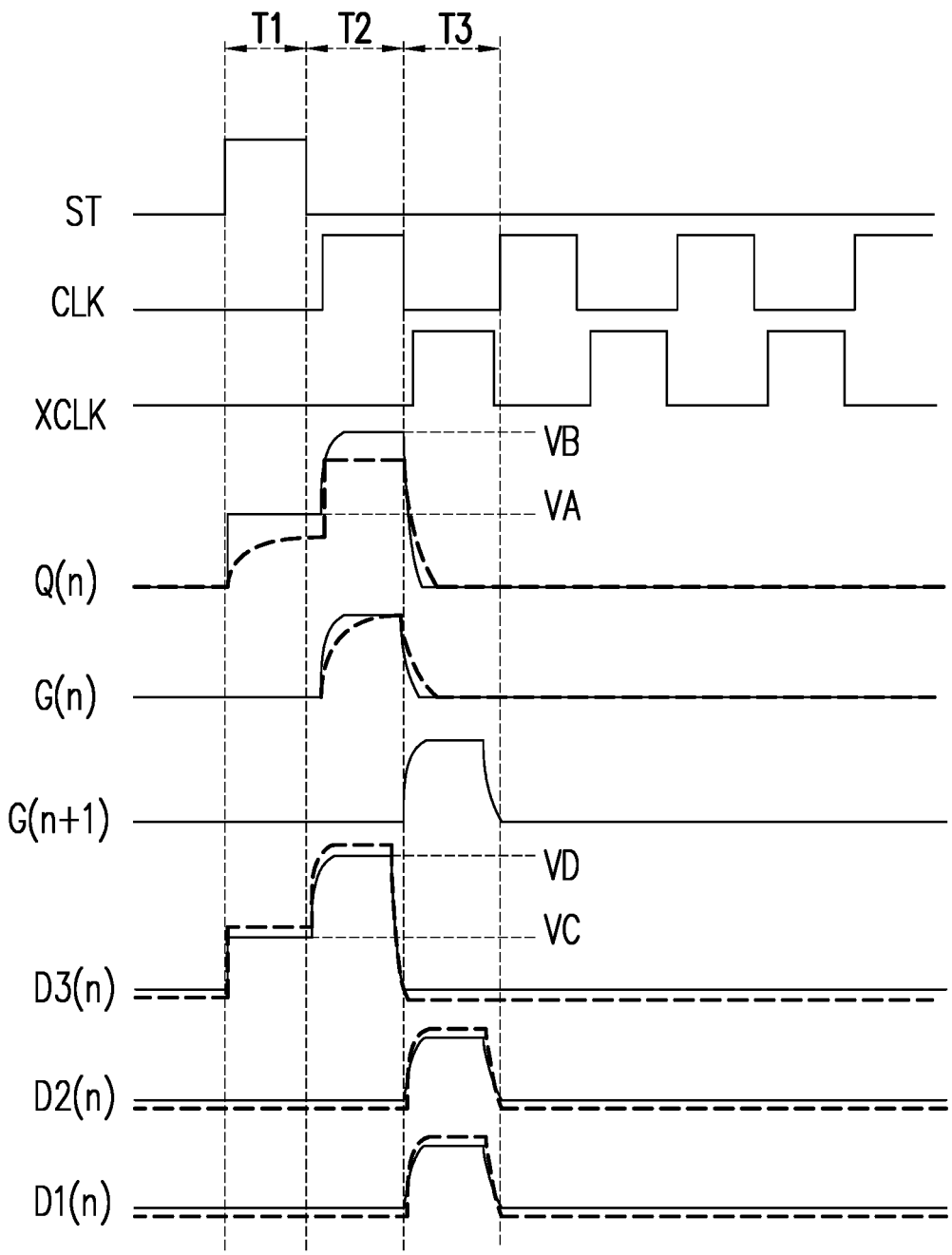
FIG. 5 illustrates a timing diagram of a shift register unit of the embodiment of FIG. 4 of the invention.

FIG. 5 illustrates a timing diagram of a shift register unit of the embodiment of FIG. 4 of the invention. Regarding detailed description of operation of a shift register unit 400, with reference to FIG. 4 and FIG. 5 together, to be specific, when the shift register unit 400 operates in a time interval T1, the start pulse signal ST may be set to be in an enabled state (e.g., in a high voltage level). At the same time, the pull-up control circuit 440 can pull up a voltage value of the drive voltage Q(n) to a voltage level VA according to the start pulse signal ST. In this way, the diode D3_1 may be turned on, and a voltage value of a gate voltage D3(n) on a second gate G2 of the dual gate transistor DGT4_3 may also be pulled up to a voltage level VC at the same time. Dotted lines of the gate voltage D3(n) in the drawings refer to that the voltage value of the drive voltage Q(n) is greater than the voltage level VC in the time interval T1.

Next, when the shift register unit 400 operates in a time interval T2 after the time interval T1, the shift register unit 400 can receive a clock signal CLK (or an inversion clock signal XCLK) through the clock signal terminal Pclk. Herein, the clock signal CLK and the inversion clock signal XCLK are inverted signals to each other. To be specific, in the time interval T2, the voltage value of the drive voltage Q(n) and the voltage value of the gate voltage D3(n) may respectively be further pulled up to a voltage level VB and a voltage level VD, as such, an anode terminal of the diode D3_1 has sufficient voltage to be turned on. In such a situation, the dual gate transistor DGT4_3 can be operated in the working state, as such, the dual gate transistor circuit 430 can pull up the output voltage G(n) on the output terminal Pout according to the clock signal CLK. In other words, in this embodiment, when the drive voltage Q(n) is set to be the high voltage level, the gate voltage D3(n) may also be pulled up to the high voltage level, so as to increase an output capability of the output voltage G(n).

Note that in this embodiment, when the shift register unit 400 operates in the time interval T1 and in the time interval T2, the voltage value of the gate voltage D1(n) of the dual gate transistor DGT4_1 and the voltage value of the gate voltage D2(n) of the dual gate transistor DGT4_2 may both be set to a low voltage level. In other words, in the time interval T1 and in the time interval T2, the drive voltage Q(n) is continuously in a charging state, and at the same time, the voltage value of the gate voltage D1(n) and the voltage value of the gate voltage D2(n) are both in the low voltage level. In the embodiments of the invention, if a non-dual gate transistor is used, the problem of voltage level decreases of the drive voltage Q(n) and the output voltage G(n) (as shown by the dotted lines in the drawings of the drive voltage Q(n) and the output voltage G(n)) caused by leakage currents of the dual gate transistor DGT4_1 and the dual gate transistor DGT4_2 can be further improved. The dotted lines in the drawings of the gate voltage D1(n) and the gate voltage D2(n) schematically indicates that voltage values of the rear stage output signal G(n+1) in the time interval T1 and in the time interval T2 are less than the gate voltage D1(n) and the gate voltage D2(n).

Next, when the shift register unit 400 operates in a time interval T3 after the time interval T2, the rear stage output signal G(n+1) can be set to be in the enabled state (e.g., in the high voltage level). At the same time, the dual gate transistor circuit 410 can pull down the drive voltage Q(n) on the drive terminal P1 according to the rear stage output signal G(n+1). Furthermore, the dual gate transistor circuit 420 may pull down the output voltage G(n) on the output terminal Pout according to the rear stage output signal G(n+1).

Furthermore, in the time interval T3, the voltage value of the gate voltage D1(n) of the dual gate transistor DGT4_1 and the voltage value of the gate voltage D2(n) of the dual gate transistor DGT4_2 may both be set to be in the high voltage level. In other words, when the drive voltage Q(n) and the output voltage G(n) are to be adjusted or restored to the low voltage level, since the voltage value of the gate voltage D1(n) and the voltage value of the gate voltage D2(n) are both in the high voltage level, capabilities of pulling down voltages of the dual gate transistor circuit 410 and the dual gate transistor circuit 420 can be enhanced. In this way, time consumption to lower the drive voltage Q(n) and the output voltage G(n) to the low voltage level can be further reduced.

In view of the foregoing, when the dual gate transistor circuit provided by the invention is operated in the working state, the voltage difference between the first gate and the second gate of the dual gate transistor can be enabled to be a relatively great positive value. Furthermore, when the dual gate transistor circuit is operated in an off (or idle) state, the voltage difference between the first gate and the second gate of the dual gate transistor is enabled to be a negative value. In this way, in the dual gate transistor circuit of this invention, the working current can be increased in the working state, and the leakage current can be reduced in the off (or idle) state. Therefore, working performance of the dual gate transistor circuit is further enhanced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A dual gate transistor circuit, comprising:
   a dual gate transistor, having a first gate and a second gate, the first gate receiving a drive signal;
   a first diode, connected in series between the first gate and the second gate according to a first-polarity direction; and
   a second diode, connected in series between the first gate and the second gate according to a second-polarity direction,
   wherein the first-polarity direction is opposite to the second-polarity direction.

2. The dual gate transistor circuit as claimed in claim 1, wherein the first diode comprises:
   at least one first transistor, a control terminal and a first terminal of the at least one first transistor being coupled to the first gate, a second terminal of the at least one first transistor being coupled to the second gate, the at least one first transistor being an n-type transistor.

3. The dual gate transistor circuit as claimed in claim 2, wherein the second diode comprises:
   at least one second transistor, a control terminal and a first terminal of the at least one second transistor being coupled to the second gate, a second terminal of the at least one second transistor being coupled to the first gate, the at least one second transistor being an n-type transistor.

4. The dual gate transistor circuit as claimed in claim 2, wherein the second diode comprises:
   at least one second transistor, a control terminal and a first terminal of the at least one second transistor being coupled to the first gate, a second terminal of the at least one second transistor being coupled to the second gate, the at least one second transistor being a p-type transistor.

5. The dual gate transistor circuit as claimed in claim 1, wherein the first diode is turned on and a voltage value on the first gate of the dual gate transistor is greater than a voltage value on the second gate of the dual gate transistor when the drive signal is a positive-polarity voltage.

6. The dual gate transistor circuit as claimed in claim 1, wherein the second diode is turned on and a voltage value on the first gate of the dual gate transistor is less than a voltage value on the second gate of the dual gate transistor when the drive signal is a negative-polarity voltage.

7. A pixel circuit, comprising:
   the dual gate transistor circuit as claimed in claim 1, wherein a first terminal of the dual gate transistor receives a data signal;
   a pixel capacitor, coupled to a second terminal of the dual gate transistor; and
   a storage capacitor, one terminal of the storage capacitor being coupled to the second terminal of the dual gate transistor, another terminal of the storage capacitor receiving a common voltage.

8. A gate drive circuit, comprising:
   a plurality of shift register units, coupled in series to form a shift register circuit, wherein an Nth stage shift register unit comprises:
   a first dual gate transistor circuit, coupled between a drive terminal and a reference grounding terminal, being controlled by a rear stage output signal to pull down a drive voltage on the drive terminal;
   a second dual gate transistor circuit, coupled between an output terminal and the reference grounding terminal, being controlled by a rear stage output signal to pull down an output voltage on the output terminal;
   a third dual gate transistor circuit, coupled between a clock signal terminal and the output terminal, being controlled by the drive voltage to pull up the output voltage on the output terminal according to a clock signal on the clock signal terminal, wherein each of the first dual gate transistor circuit, the second dual gate transistor circuit, and the third dual gate transistor circuit comprises:

a dual gate transistor, having a first gate and a second gate;

a first diode, connected in series between the first gate and the second gate according to a first-polarity direction; and a second diode, connected in series between the first gate and the second gate according to a second polarity direction, wherein the first-polarity direction is opposite to the second-polarity direction, the first gate of the first dual gate transistor circuit and the first gate of the second dual gate transistor circuit receive the rear stage output signal, and the first gate of the third dual gate transistor circuit receives the drive voltage.

9. The gate drive circuit as claimed in claim 8, further comprising:

a pull-up control circuit, coupled to the drive terminal, receiving a start pulse signal to pull up a voltage value of the drive voltage on the drive terminal according to the start pulse signal.

10. The gate drive circuit as claimed in claim 8, wherein the first diode comprises:

at least one first transistor, a control terminal and a first terminal of the at least one first transistor being coupled to the first gate, a second terminal of the at least one first transistor being coupled to the second gate, the at least one first transistor being an n-type transistor.

11. The gate drive circuit as claimed in claim 10, wherein the second diode comprises:

at least one second transistor, a control terminal and a first terminal of the at least one second transistor being coupled to the first gate, a second terminal of the at least one second transistor being coupled to the second gate, the at least one second transistor being a p-type transistor.

12. The gate drive circuit as claimed in claim 10, wherein the second diode comprises:

at least one second transistor, a first terminal of the at least one second transistor being coupled to the first gate, a control terminal and a second terminal of the at least one second transistor being coupled to the second gate, the at least one second transistor being an n-type transistor.

* * * * *